US012593656B2

(12) United States Patent
Chaji et al.

(10) Patent No.: US 12,593,656 B2
(45) Date of Patent: Mar. 31, 2026

(54) HYBRID RELEASE LAYER FOR MICRODEVICE CARTRIDGE

(71) Applicant: VueReal Inc., Waterloo (CA)

(72) Inventors: Gholamreza Chaji, Waterloo (CA);
Lauren Lesergent, Kitchener (CA)

(73) Assignee: VueReal Inc., Waterloo (CA)

( * ) Notice: Subject to any disclaimer, the term of this patent is extended or adjusted under 35 U.S.C. 154(b) by 482 days.

(21) Appl. No.: 18/007,103

(22) PCT Filed: Jul. 27, 2021

(86) PCT No.: PCT/CA2021/051048
§ 371 (c)(1),
(2) Date: Jan. 27, 2023

(87) PCT Pub. No.: WO2022/020946
PCT Pub. Date: Feb. 3, 2022

(65) Prior Publication Data
US 2023/0230869 A1      Jul. 20, 2023

Related U.S. Application Data

(60) Provisional application No. 63/056,986, filed on Jul. 27, 2020.

(51) Int. Cl.
H01L 21/683 (2006.01)
B81C 1/00 (2006.01)

(52) U.S. Cl.
CPC ...... H01L 21/6835 (2013.01); B81C 1/00476 (2013.01); H01L 2221/68318 (2013.01); H01L 2221/68381 (2013.01)

(58) Field of Classification Search
CPC ....... H01L 21/6835; H01L 2221/68318; H01L 2221/68381; H01L 25/0753; H01L 25/50; B81C 1/00476; B81C 3/008; H10H 20/01
USPC ......................................................... 438/464
See application file for complete search history.

(56) References Cited

U.S. PATENT DOCUMENTS

| | | | | |
|---|---|---|---|---|
| 10,224,231 | B2 * | 3/2019 | Bower | H10H 20/857 |
| 10,483,434 | B2 * | 11/2019 | Liu | H10H 20/84 |
| 11,342,213 | B2 * | 5/2022 | Chang | H01L 25/0753 |
| 2014/0159066 | A1 | 6/2014 | Hu et al. | |
| 2015/0371874 | A1 | 12/2015 | Bower et al. | |
| 2016/0181476 | A1 * | 6/2016 | Chang | H01L 24/95 |
| | | | | 257/13 |
| 2022/0270908 | A1 * | 8/2022 | Chaji | H01L 25/0753 |

FOREIGN PATENT DOCUMENTS

WO          2018096455  A1      5/2018

OTHER PUBLICATIONS

WIPO: PCT International Search Report and Written Opinion relating to PCT application No. PCT/CA2021/051048, dated Oct. 26, 2021.

* cited by examiner

*Primary Examiner* — Vu A Vu

(57) ABSTRACT

This disclosure is related to integrating pixelated microdevices into a system substrate to develop a functional system such as display, sensors, and other optoelectronic devices. The process may involve having a structure of release layers in the housing and then using different decoupling mechanisms for release. The release layers are not limited to but can be a combination of chemical or optical or mechanical release layers.

17 Claims, 4 Drawing Sheets

300

312

100

100

200

300

HYBRID RELEASE LAYER FOR MICRODEVICE CARTRIDGE

FIELD OF THE INVENTION

The present disclosure relates to the integration of microdevices into a system substrate.

BRIEF SUMMARY

A few embodiments of this description are related to integration of microdevices into the system substrate. The patterning of microdevice donor substrate and receiver substrate can be used in combination with different transfer technology including but not limited to pick and place with different mechanisms (e.g., electrostatic transfer head, elastomer transfer head), or direct transfer mechanism such as dual function pads and more.

In one embodiment, a part of the microdevice structure is covered by housing layers while the housing layers are separated from the microdevice by release layers.

In one case, the release layer(s) is a chemical, a mechanical or an optical release layer.

In one embodiment, there is a microdevice transfer method for integrating microdevices into a system substrate the method comprising, having microdevices in a donor substrate, coupling the microdevices to the donor substrate with a release layer; and decoupling the release layer prior to transfer of microdevices into a system backplane.

BRIEF DESCRIPTION OF THE DRAWINGS

The foregoing and other advantages of the disclosure will become apparent upon reading the following detailed description and upon reference to the drawings.

Figure 1A:
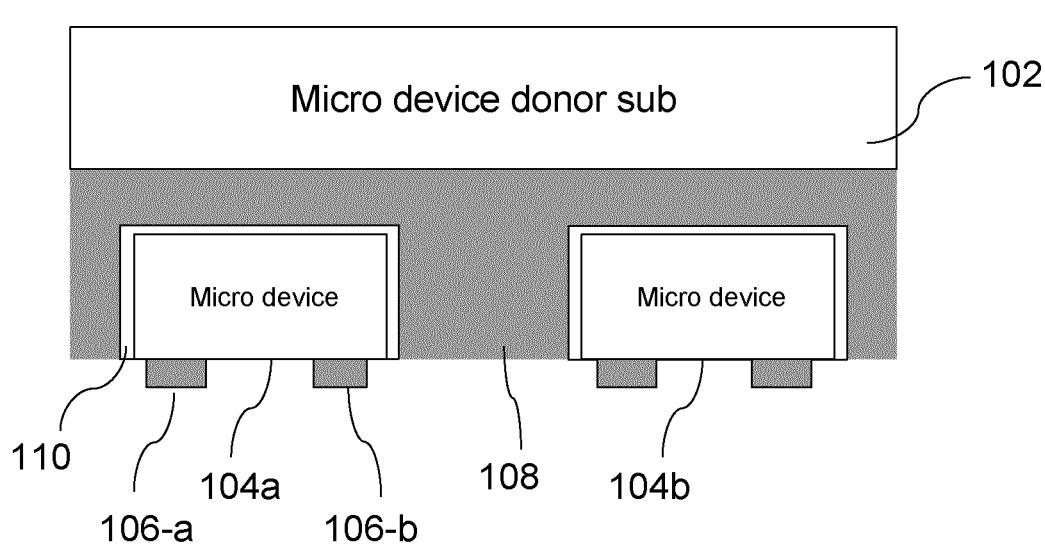
FIGS. 1A-1C. show a microdevice donor setup including donor substrate, microdevice, housing layers and a release layer.

The present disclosure is susceptible to various modifications and alternative forms, specific embodiments or implementations as have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

A few embodiments of this description are related to integration of microdevices into the system substrate. The system substrate may comprise micro light emitting diodes (LEDs), Organic LEDs, sensors, solid state devices, integrated circuits, (micro-electro-mechanical systems) MEMS, and/or other electronic components. Other embodiments are related to patterning and placing of microdevices in respect to the pixel arrays to optimize the microdevice utilizations in selective transfer processes. The receiving substrate may be, but is not limited to, a printed circuit board (PCB), thin film transistor backplane, integrated circuit substrate, or, in one case of optical microdevices such as LEDs, a component of a display, for example a driving circuitry backplane. The patterning of microdevice donor substrate and receiver substrate can be used in combination with different transfer technology including but not limited to pick and place with different mechanisms (e.g. electrostatic transfer head, elastomer transfer head), or direct transfer mechanism such as dual function pads and more.

In one embodiment, a part of the microdevice structure is covered by housing layers while the housing layers are separated from the microdevice by release layers.

In one case, the release layer(s) is a chemical, a mechanical or an optical release layer. In the case of chemical release layers, the layer(s) is removed or changed by chemical prior to transfer. The challenge is that it can take several hours or a perforated substrate and layers for the donor is needed which is hard to develop and may cause damage to the microdevice during processing. Optical layers are easy and fast to remove or change on the surface of the device. However, if the layer(s) are on the side, it is difficult and impractical. The mechanical release layer does not need to be removed prior to the transfer of microdevices into the system substrate. The challenge is that these layers respond to one direction of force (generally polling and not to sheer force). Therefore, if the release layer is on the wall of the device, it will not work as polling the microdevice from the donor substrate will result in sheer force on the wall. As a result, the microdevice will not be released from the wall. The embodiments described here are designed to address these challenges.

Figure 1B:
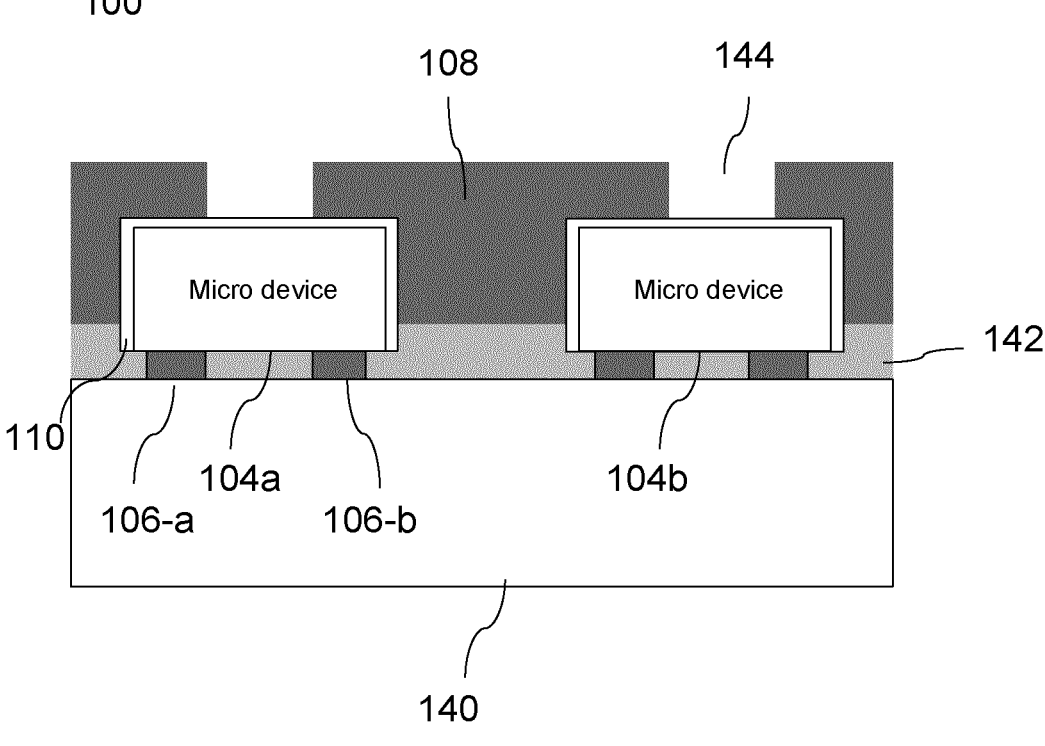
Figure 1C:
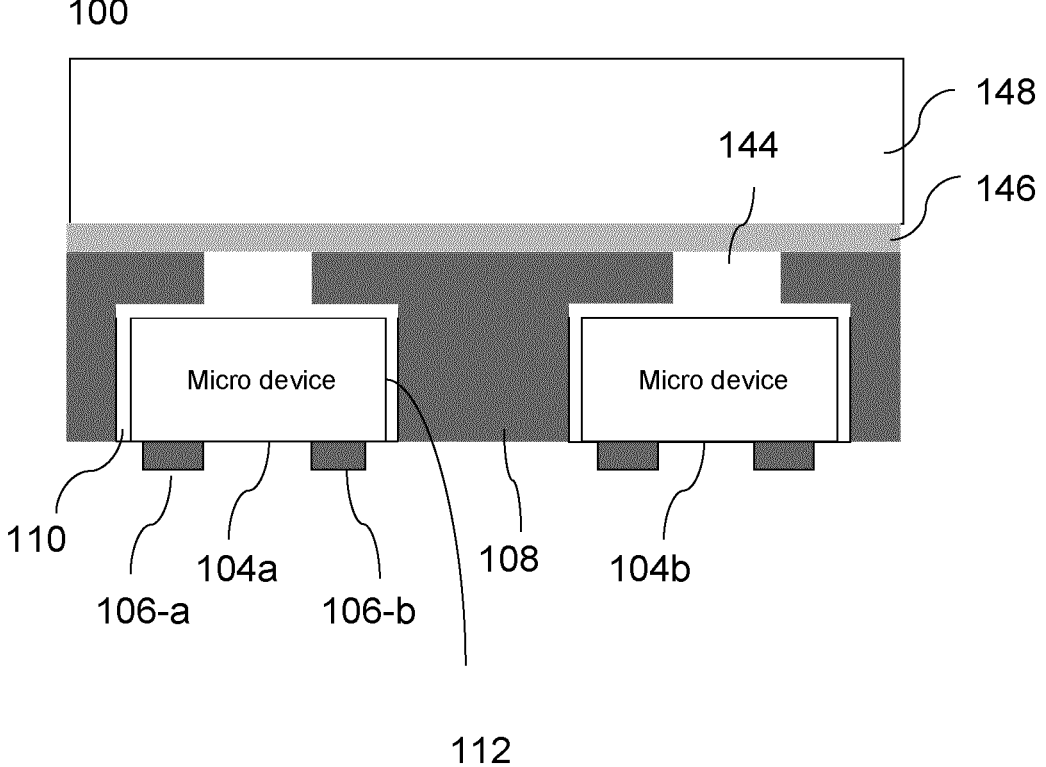

FIGS. 1A to 1C show a microdevice donor setup 100 including donor substrate 102, microdevices 104a and 104b and housing layers 108. The microdevices can have contacts and pads on different surfaces. FIG. 1A shows contacts 106a and 106b on the top surface, they face away from the donor substrate. There is a release layer(s) 110 between the microdevice and housing layers. There can be anchors either on the top surface of the microdevice or the bottom surface, facing the donor substrate or the sidewalls 112 (FIG. 1C) of the microdevice (facing to housing). The release layer 110 can be a chemical release layer. The challenge is to remove the release layer on the bottom side of the microdevice 104a and 104b. This process can take a few hours which can cause damage to other layers including housing, anchors, and the microdevice itself. In one case, the interface between the bottom surface and the release layer can be damaged by a light source (e.g. laser). Therefore, the release layer is only needed to be removed from the sidewalls which is a much faster process.

In another case, demonstrated in FIG. 1B and FIG. 1C, access holes 144 are formed in the housing layer after transferring the housing layers into a temporary (or another donor) substrate 140. Bonding layers 142 can be used to attach the layers to the temporary substrate 140. In another case, the housing layer can be etched back to expose the bottom surface of the microdevice and the release layer. The release layer can be removed partially or fully. In this case as shown in FIG. 1C, the microdevice can be transferred to a system substrate directly from substrate 140 or it is bonded to another substrate 148 using bonding layer 146.

Figure 2:
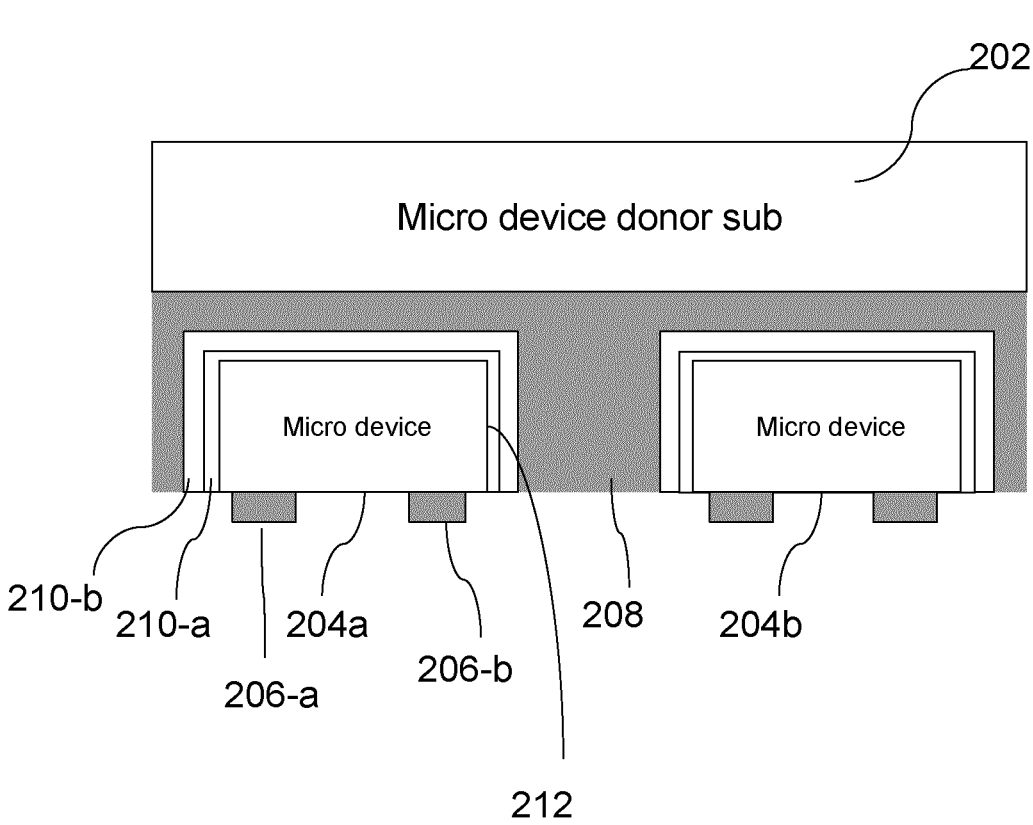
FIG. 2 shows a microdevice donor setup including donor substrate, microdevice, housing layers and two types of release layers.

FIG. 2 shows a microdevice donor setup 200 including donor substrate 202, microdevices 204a and 204b and housing layers 208. The microdevices can have contacts and pads on different surfaces. FIG. 2 shows contacts 206a and 206b on the top surface, facing the donor substrate 202. There can be anchors either on the top surface of the microdevice or the bottom surface, facing the donor substrate or the sidewalls of the microdevice (facing towards housing). In one embodiment, at least two types of release layers 210a and 210b are covering at least part of the bottom surface, the surface facing the donor substrate 202. The release layers can be a combination of chemical or optical or mechanical release layers.

In one case, the chemical release layer covers the sidewalls 212 and the bottom surface and the other type of either mechanical or optical release layer at least covers part of the bottom surface. The chemical release layer is only needed to be removed from the sidewall and may be the part of the bottom surface not covered by the other type of release layer. This process can be fast. The mechanical or optical release layer can be released prior to transfer or during transfer of microdevices into the system substrate. If the mechanical or optical release layer is removed or changed prior to the microdevice transfer, the chemical release layer can be removed prior to the optical so that the device does not fall out due to the push caused by the optical release layer.

Figure 3:
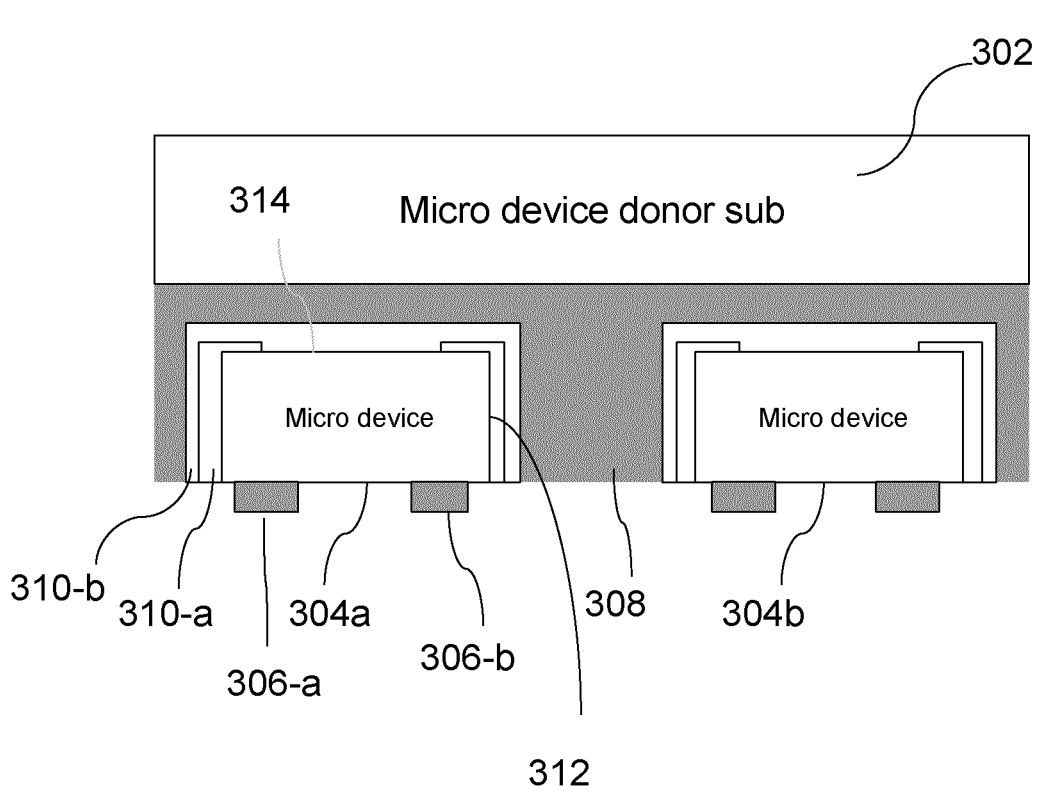
FIG. 3 shows a microdevice donor setup including donor substrate, microdevice, housing layers and two types of release layers, with the first release layer having an opening.

FIG. 3 shows a donor setup 300 including donor substrate 302, microdevices 304a and 304b and housing layers 308. The microdevices can have contacts and pads on different surfaces. FIG. 3 shows contacts 306a and 306b on the top surface, they face away from the donor substrate 302. There can be anchors either on the top surface of the microdevice or the bottom surface, facing the donor substrate or the sidewalls 312 of the microdevice (facing to housing). In one embodiment, at least two types of release layers 310a and 310b are covering at least part of the bottom surface, the surface facing the donor substrate 302. The release layers can be a combination of chemical or optical or mechanical release layers.

In one case, the chemical release layer covers the sidewalls and the bottom surface and the other type of either mechanical or optical release layer covers at least g part of the bottom surface. There is an opening 314 in the first release layer 310a. The chemical release layer is only needed to be removed from the sidewall 312 and may be the part of the bottom surface not covered by the other type of release layer. This process can be fast. The mechanical or optical release layer can be released prior to transfer or during transfer of microdevices into the system substrate. If the release layer is removed or changed prior to transfer, the chemical release layer can be removed prior to the optical so that the device does not fall out due to the push caused by the optical release layer.

Method Aspect

The invention discloses a microdevice transfer method for integrating microdevices into a system substrate. The method comprises having microdevices in a donor substrate, coupling the microdevice to the donor substrate with a release layer, and decoupling the release layer by a chemical, an optical or a mechanical process, prior to the transfer of microdevices into a system backplane. There are more than one release layers, and the release layers have two different decoupling mechanisms. Access holes are formed in the housing layers after transferring the housing layers into a temporary substrate using bonding layers. Furthermore, the chemical decoupling mechanism from the sidewall of the microdevice and the release layer of the bottom side of the microdevice facing the donor substrate is based on factors other than chemical release.

The microdevices have contacts facing away from the donor substrate. The top or bottom surface of the microdevice have anchors facing the donor substrate or sidewalls of the microdevice. The housing layer is etched to expose the bottom surface of the microdevice and the release layer, wherein the release layer is removed fully or partially. Here, the microdevice is transferred to a system substrate directly from the donor substrate or it is bonded to another substrate using a bonding layer.

There are at least two types of release layers, which are a combination of chemical or optical or mechanical release layers, covering at least part of the bottom surface of the microdevice, the bottom surface facing the donor substrate. There is an opening in the first release layer. The chemical release layer covers the sidewalls and the bottom surface and the other types of release layers either mechanical or optical release layer, at least cover a part of the bottom surface. Furthermore, the chemical release layer is only needed to be removed from the sidewall and the part of the bottom surface not covered by the other type of release layers. The mechanical or optical release layer is released prior to a transfer or during the transfer of microdevices into the system substrate. Lastly, the chemical release layer is removed prior to the optical, if the optical release layer is removed or changed prior to the microdevice transfer.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A microdevice transfer method for integrating microdevices into a system substrate the method comprising:
   having a microdevice in a donor substrate;
   providing a housing layer between the microdevice and the donor substrate;
   providing a release layer, the release layer adjoining the micro device and housing layer and disposed therebetween;
   decoupling the release layer by a chemical, an optical or a mechanical process, prior to transfer of the microdevice into a system backplane; and
   transferring the housing layer into a temporary substrate using bonding layers and forming access holes in the housing layer.

2. The method of claim 1, wherein there is more than one release layer.

3. The method of the claim 2, wherein the more than one release layer has two different decoupling mechanisms.

4. The method of the claim 1, wherein decoupling the release layer prior to transfer of the microdevice into a system backplane includes decoupling a chemical release layer from a sidewall of the microdevice and decoupling a second release layer from a bottom side of the microdevice facing the donor substrate, the second release layer other than a chemical release layer.

5. The method of claim 1, wherein the microdevice has contacts facing away from the donor substrate.

6. The method of claim 1, wherein a top surface or a bottom surface of the microdevice has anchors, facing the donor substrate or sidewalls of the microdevice.

7. The method of claim 1, wherein the housing layer is etched to expose a bottom surface of the microdevice and the release layer.

8. The method of claim 7, wherein the release layer is removed fully or partially.

9. The method of claim 8, wherein the microdevice is transferred to a system substrate directly from the donor substrate or it is bonded to another substrate using a bonding layer.

10. The method of claim 8, wherein the microdevice is bonded to another substrate using the bonding layer.

11. The method of claim 1, wherein there are at least two types of release layers covering at least part of the bottom surface of the microdevice, the bottom surface facing the donor substrate.

12. The method of claim 11, wherein the release layers are a combination of chemical or optical or mechanical release layers.

13. The method of claim 12, wherein the chemical release layer covers the sidewalls and the bottom surface and the other types of release layers either mechanical or optical release layer at least covers a part of the bottom surface.

14. The method of claim 13, wherein the chemical release layer is only needed to be removed from the sidewall and the part of the bottom surface not covered by the other type of release layers.

15. The method of claim 13, wherein the mechanical or optical release layer is released prior to a transfer or during the transfer of microdevices into the system substrate.

16. The method of claim 15, wherein the chemical release layer is removed prior to the optical if the optical release layer is removed or changed prior to the microdevice transfer.

17. The method of claim 12, wherein there is an opening in a first release layer.

* * * * *